(12) United States Patent
Rice

(10) Patent No.: US 6,910,794 B2
(45) Date of Patent: Jun. 28, 2005

(54) AUTOMOTIVE LIGHTING ASSEMBLY COOLING SYSTEM

(75) Inventor: Lawrence M. Rice, Anderson, IN (US)

(73) Assignee: Guide Corporation, Pendleton, IN (US)

( * ) Notice: Subject to any disclaimer, the term of this patent is extended or adjusted under 35 U.S.C. 154(b) by 13 days.

(21) Appl. No.: 10/423,140

(22) Filed: Apr. 25, 2003

(65) Prior Publication Data

US 2004/0213016 A1 Oct. 28, 2004

(51) Int. Cl.$^7$ .............................................. F21V 29/00
(52) U.S. Cl. ...................................... 362/547; 362/373
(58) Field of Search ................................ 362/218, 264, 362/294, 345, 373, 547

(56) References Cited

U.S. PATENT DOCUMENTS

| | | | |
|---|---|---|---|
| 4,081,023 A | * | 3/1978 | Edelstein et al. ........... 362/294 |
| 4,204,246 A | | 5/1980 | Arii et al. |
| 4,411,516 A | * | 10/1983 | Adachi et al. .............. 362/218 |
| 4,729,076 A | * | 3/1988 | Masami et al. ............. 362/294 |
| 4,733,335 A | * | 3/1988 | Serizawa et al. ........... 362/373 |
| 5,038,255 A | | 8/1991 | Nishihashi et al. |
| 5,268,812 A | | 12/1993 | Conte |
| 5,347,387 A | | 9/1994 | Rice |
| 5,632,551 A | | 5/1997 | Roney et al. |
| 5,890,794 A | | 4/1999 | Abtahi et al. |
| 6,113,212 A | | 9/2000 | Ng |
| 6,349,553 B1 | | 2/2002 | Pfister et al. |
| 6,371,636 B1 | | 4/2002 | Wesson |
| 6,377,459 B1 | | 4/2002 | Gonsalves et al. |
| 6,407,921 B1 | | 6/2002 | Nakamura et al. |
| 6,481,874 B2 | | 11/2002 | Petroski |
| 6,517,221 B1 | * | 2/2003 | Xie ............................. 362/373 |
| 2003/0227774 A1 | * | 12/2003 | Martin et al. ............... 362/240 |

FOREIGN PATENT DOCUMENTS

JP 58108758 6/1983

* cited by examiner

Primary Examiner—Alan Cariaso
(74) Attorney, Agent, or Firm—Ice Miller

(57) ABSTRACT

An automotive lighting assembly cooling system includes a heat pipe with an evaporation area proximate to a heat generating component, such as a Light Emitting Diode (LED), and a condensing area located remote from the evaporation area. Evaporation of fluid within the heat pipe transfers heat away from the heat generating component. The efficiency of the cooling system in one embodiment is increased by including fins associated with the condensing area and placing the fins in an area where air flow external to a moving vehicle assists in cooling the fins.

9 Claims, 4 Drawing Sheets

AUTOMOTIVE LIGHTING ASSEMBLY COOLING SYSTEM

BACKGROUND OF THE INVENTION

Generally, conventional automotive lighting systems utilize filament bulbs as a lighting source. However, filament bulbs have many drawbacks, including high consumption of electrical power, the generation of great amounts of heat, and readily breakable filaments. Recently, due to these drawbacks, light emitting semiconductor devices (LESDs), such as light emitting diodes ("LEDs"), have been adapted for use in certain automobile lighting systems.

LEDs solve many of the problems associated with filament bulbs, because they emit light using a lower voltage and current than used by a filament bulb and are less prone to breakage. However, various other problems are associated with LEDs when used in automobile lighting systems. For example, typical LEDs produce significantly less light than filament bulbs. Accordingly, a number of LEDs must be used within a particular light assembly to generate the requisite amount of light. As the number of LEDs is increased, the amount of heat generated by the LEDs increases. Alternatively, LEDs which operate at a significantly higher power may be used. Of course, as the power of the LED increases, the amount of heat generated also increases.

The increase in heat is a significant problem for LED systems. While the expected lifetime of an LED at room temperature may be tens of thousands of hours, that same LED when exposed to high temperatures may only last several thousand hours. Moreover, the amount of light emitted by an automotive lighting systems is a significant safety issue subject to various laws and regulations. Accordingly, an automotive lighting system must produce a stable luminous flux at all times throughout the lifetime of the lighting system. However, subjecting an LED to an increased temperature results in an immediate dimming of the LED at the time of exposure. Moreover, as an LED is exposed to increased temperatures over a period of time, the maximum achievable output of the LED is diminished even during uses at lower temperatures.

Therefore, a need exists for an automotive lighting system that efficiently provides for dissipation or removal of excess heat generated by LEDs within the lighting system.

BRIEF SUMMARY OF THE INVENTION

The present invention comprises an automotive lighting system including an LED thermally coupled to a heat transfer condensing tube or heat pipe at the evaporation area of the heat pipe. Fins, which may be located exterior to the vehicle, are affixed to the heat pipe to assist in transfer of heat away from the heat pipe.

In operation the heat pipe is filled with a fluid such as water or some other acceptable refrigerant. As the LED operates, heat is generated and transferred to the evaporation area through the shell of the heat pipe and then to the fluid. As the temperature of the fluid reaches its boiling point, additional heat is drawn from the heat pipe and some of the fluid changes to a vapor state, expanding throughout the void of the heat pipe.

As the vapor expands in the void, it contacts the heat pipe at a condensation area which is located remote from the area at or near which the LED is mounted. Since the shell of the heat pipe is cooler at the condensation area than the evaporation area, heat is transferred from the vapor to the heat pipe at the condensing area. Fins may be placed external the heat pipe to assist in removing heat from the heat pipe, for example, by passing air over them. Accordingly, the condensing area is maintained at a temperature below the boiling point of the fluid. Thus, as the vapor contacts condensing area, heat is transferred from the vapor to the condensing area and out through the fins. This causes the vapor to condense into droplets of fluid which are directed to the area of the heat pipe near the LED.

DETAILED DESCRIPTION OF THE INVENTION

Figure 1:
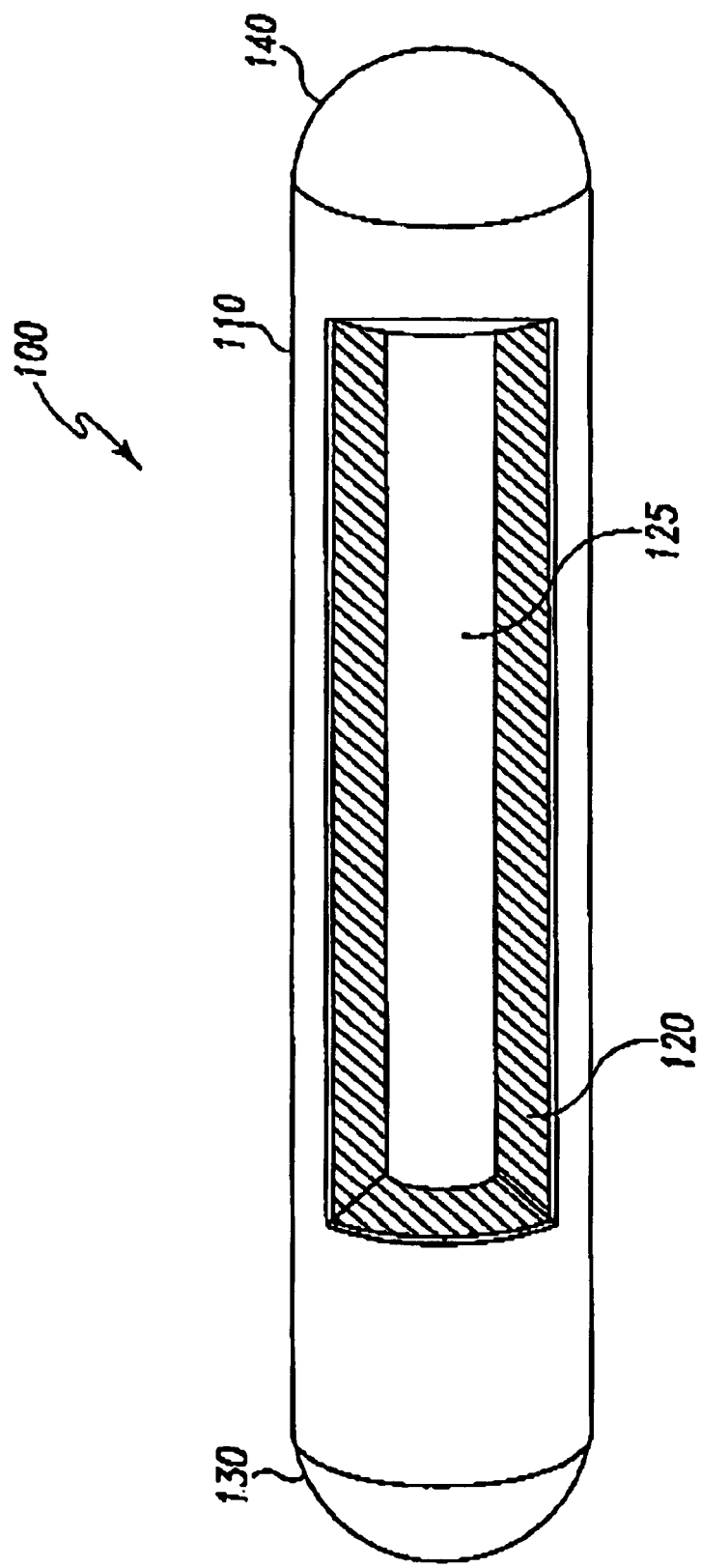
FIG. 1 is a partial cutaway view of a heat pipe.

FIG. 1 is a partial cutaway view of a heat pipe. Heat pipe 100 comprises shell 110, wick 120, evaporation area 130 and condensation area 140. Wick 120 is initially saturated with a fluid such as deionized water. The basic operation of heat pipe 100 is as follows. Evaporation area 130 is placed so as to be thermally coupled to a heat generation site. Condensation area 140 is placed in an area which is at a lower temperature relative to the heat generating site. Thus, as heat is generated, the heat is transferred to heat pipe 100 at evaporation area 130. As heat is transferred to evaporation area 130, the fluid within wick 120 near to evaporation area 130 is heated. As the heated fluid reaches its vaporization temperature, the fluid is vaporized, thus absorbing more heat. The vaporized fluid expands into void 125 defined by shell 110, transferring heat by convection away from evaporation area 130.

The vaporized fluid expands within shell 110 to condensation area 140. Condensation area 140 is cooler than evaporation area 130, and is below the boiling point of the fluid. Therefore, as the vaporized fluid comes in contact with condensation area 140, the vaporized fluid condenses and is absorbed into wick 120. Condensation of the fluid releases heat of vaporization into condensation area 140. Heat transferred from the fluid at condensation area 140 is passed through shell 110 to a heat sink external to heat pipe 100. The external heat sink may comprise air within the body of a vehicle, air external to the vehicle, or even the vehicle itself.

Wicking is used to accelerate the transfer of fluid condensed at condensation area 140 to evaporation area 130. This transfer results from capillary action within wick 120 The condensation of fluid at condensation area 140 and evaporation of fluid at evaporation area 140 results in comparatively more fluid within wick 120 at condensation area 140 compared to evaporation area 130. Thus, fluid flows within wick 120 from condensation area 140 to evaporation area 130. Wicking is useful in that transfer of fluid is not dependent on the orientation of heat pipe 100.

Figure 2:
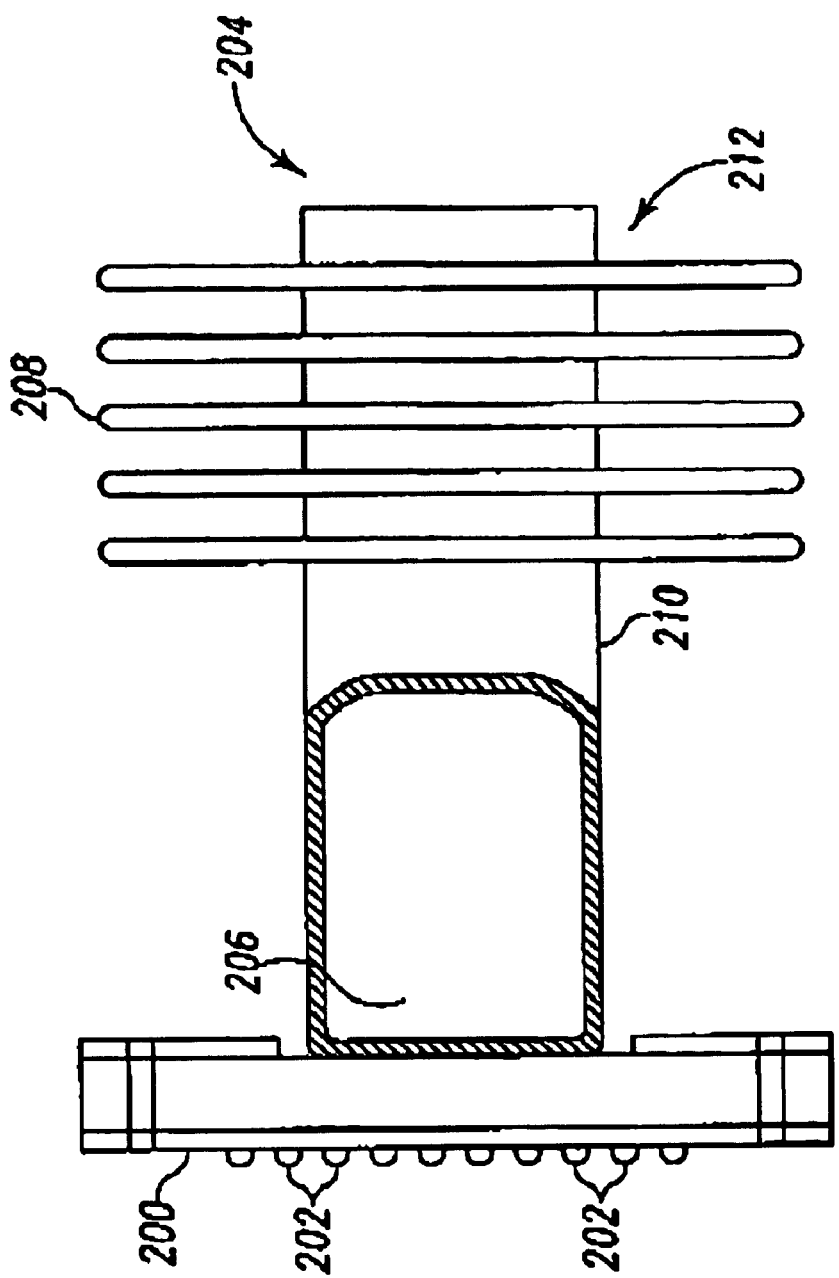
FIG. 2 is a partial cutaway plan view of one embodiment of an LED condensation cooling system in accordance with the present invention.

With reference to FIG. 2, a partial cutaway plan view of one embodiment of an LED condensation cooling system in accordance with the present invention is shown. LED panel 200 is designed to be located within the light assembly of a vehicle. LED panel 200 includes a number of individual LEDs 202 and is selected from material with desired thermal conductivity such that heat generated by LEDs 202 may be transferred through LED panel 200. The number of LEDs is a design choice. Heat pipe 204 is thermally coupled to LED panel 200 at evaporation area 206. Thermal coupling may be realized in any acceptable manner. By way of example, but not of limitation, thermal coupling may be achieved by placing heat pipe 204 in direct contact with LED panel 200 or by bonding heat pipe 204 to LED panel 200 with a thermally conducting epoxy.

Heat pipe 204 includes fins 208 which protrude from shell 210. Fins 208 increase the effective surface area of shell 210 in the proximity of condensation area 212. Accordingly, the transfer of heat out of heat pipe 204 is increased. Heat transfer may also be increased by forcing air past shell 210 and/or fins 208. Heat transfer into heat pipe 210 may also be increased by the use of fins. For example, by locating fins within evaporation area 206, the surface area may be increased, resulting in increased transfer of heat. Use of fins within the evaporation area of a heat pipe is particularly useful when using heat pipes designed to have a reservoir of fluid in the condensation area.

Figure 3:
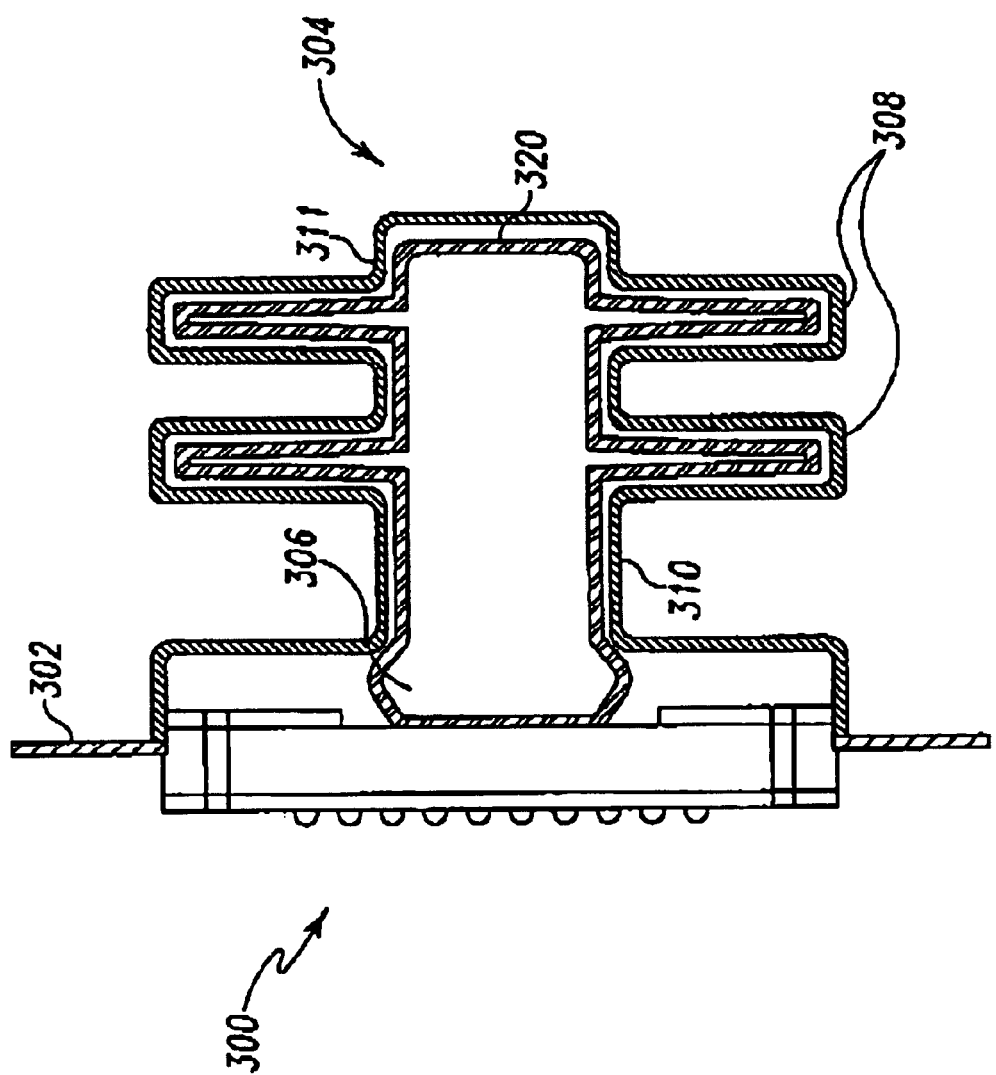
FIG. 3 is a sectional view of an alternate embodiment of an LED condensation cooling system in accordance with the present invention is shown.

Referring now to FIG. 3, another embodiment of the present invention is shown. LED panel 300 is designed to be located within light assembly 302. Heat pipe 304 is thermally coupled to LED panel 300 at evaporation area 306. LED panel 300 and heat pipe 304 in this embodiment are an integrated unit. Heat pipe 304 includes fins 308 which protrude from shell 310 at condensation area 311. Fins 308 in this embodiment are hollow, and wick 320 extends into fins 308 to increase flow of fluid away from condensation area 311 and toward evaporation area 306.

As stated above, increased heat transfer may be realized by increasing the flow of air across the evaporation area and/or the fins of the heat pipe. This flow of air may be realized in a variety of embodiments. For example, the evaporating area and/or fins may have a dedicated fan or the vehicle's engine compartment fan may be used to direct air flow across the evaporating area and/or fins.

Figure 4:
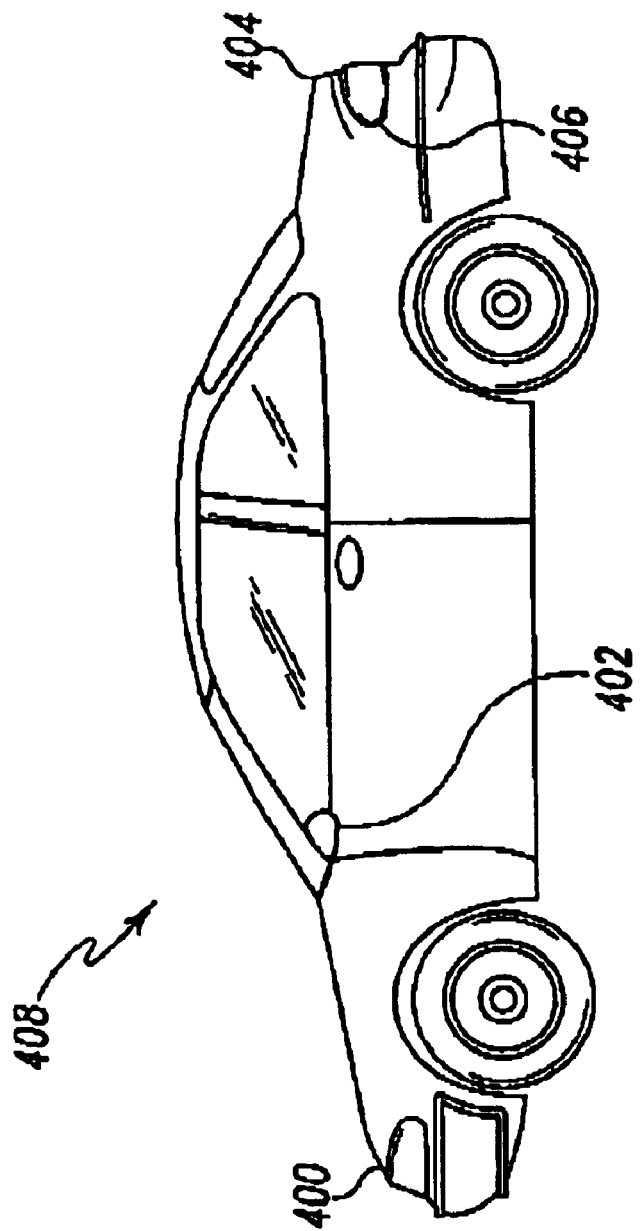
FIG. 4 is a side view of an automobile showing some exemplary locations for placement of the condensing area of a heat pipe.

Alternatively, the evaporating area and/or fins may be mounted so as to make use of the air flow around the vehicle as the vehicle moves. FIG. 4 shows exemplary locations 400, 402, 404 and 406 on vehicle 408 which may be particularly advantageous in practicing this aspect of the invention. According to one embodiment, evaporating area and/or fins may be mounted so as to allow for thermal coupling through the outer surface of the vehicle. Other embodiments include mounting a heat pipe so that the evaporating area and/or fins of the heat pipe are directly exposed to air flow around vehicle 408 while being flush with the outer surface of the vehicle.

While the present invention has been described in detail with reference to certain exemplary embodiments thereof, such are offered by way of non-limiting example of the invention, as other versions are possible. By way of example, but not of limitation, the present invention is flexible enough to allow for a variety of design choices in addition to those set forth above. For example, the evaporating area and/or fins of the heat pipe may be designed to extend beyond the outer surface of the vehicle, such as in the form of a styling feature. Additionally, the evaporating area and/or fins of the heat pipe may be camouflaged as trim pieces. Moreover, fins may be included either inside or outside of the shell at the evaporation area and/or the condensation area to provide for additional heat transfer. These and other modifications are within the scope of the present invention.

Furthermore, in practicing the present invention, the heat pipe may be constructed of any suitable material or materials. Suitable materials may include, but are not limited to, aluminum, stainless steel, or copper. Design considerations in selection of the material may include heat conductivity, cost, aesthetics, and compatibility with other materials either in the light assembly or the vehicle.

Additionally, while certain embodiments discussed above include use of a wicking material, a number of alternative embodiments exist. For example, wicking may be provided by artery wicks, sintered material, slab and tunnel wicks, wrapped screens or the formation of microgrooves with the walls of the heat pipe. Alternatively, the heat pipe may be fabricated with smooth walls, with the condensation area located above the evaporation area such that as the vapor condenses into fluid state, the fluid flows to the evaporation area due to gravity.

Moreover, the fluid and pressure may be selected so as to provide the desired cooling capability in consideration of the fluid's latent heat of vaporization and thermal conductivity. Accordingly, the fluid may be deionized water, anhydrous ammonia, Freon, or oil or any other suitable fluid and the pressure within the heat pipe may be modified upward or downward so as to effect the desired temperature of condensation and boiling point. It is anticipated that a variety of other modifications and changes will be apparent to those having ordinary skill in the art and that such modifications and changes are intended to be encompassed within the spirit and scope of the invention as defined by the following claims.

I claim:

1. A method of cooling an automotive lighting assembly comprising the steps of:
   (a) providing a heat pipe with a shell that defines a condensing area and an evaporation area,
   (b) providing a fluid contained within the shell of the heat pipe, the fluid located at the evaporation area,
   (c) providing fins within the shell of the heat pipe at the condensation area,
   (d) thermally coupling the light assembly to the shell of the heat pipe proximate to the evaporation area,
   (e) transferring heat from the light assembly though the shell of the heat pipe to the fluid to cause the fluid to evaporate and form a vapor,
   (f) thermally coupling a heat sink external to the heat pipe to the shell at a location proximate to the condensation area; and
   (g) transferring heat from the vapor through the shell of the heat pipe at the condensation area and the fins to the heat sink.

2. The method of claim 1 wherein the step of thermally coupling the heat sink external to the heat pipe too the shell of the heat pipe at the location-proximate to the condensation area further comprises the step of,
   thermally coupling the heat sink external to a vehicle to the heat pipe.

3. The method of claim 1 wherein the step of thermally coupling the heat sink external to the heat pipe to the shell of the heat pipe at the location proximate to the condensation area farther comprises the step of,
   thermally coupling a portion of a vehicle to the heat pipe.

4. An automotive lighting assembly cooling system comprising, a heat pipe with a shell, an evaporation area and a condensation area located remote from the evaporation area, the condensation area designed to be thermally coupled to a heat sink external to the body of a vehicle when the heat pipe is mounted to a lighting assembly which is mounted to the vehicle, and fluid located within the shell at the condensation area.

5. The automotive lighting assembly cooling system of claim 4 further comprising fins thermally coupled to the heat pipe at a location proximate the condensation area, the fins designed to be thermally coupled to a heat sink external to the body of a vehicle when the heat pipe is mounted to a lighting assembly which is mounted to the vehicle.

6. The automotive lighting assembly cooling system of claim 5 further comprising, wicking means located within the shell for transferring fluid from the condensation area to the evaporation area.

7. The automotive lighting assembly cooling system of claim 4, wherein the heat pipe is designed such that the heat pipe is not visible from external the vehicle, when the lighting assembly is mounted to the vehicle.

8. The automotive lighting assembly cooling system of claim 4, further comprising at least one fin thermally coupled to the heat pipe at a location proximate the condensation area, the fins designed to protrude from the body of the vehicle when the lighting assembly which is mounted to the vehicle.

9. The automotive lighting assembly cooling system of claim 8, wherein the at least one fin defines an interior space, the interior space in fluid communication with the condensation area.

\* \* \* \* \*